United States Patent
Nido et al.

(10) Patent No.: US 6,329,716 B1
(45) Date of Patent: *Dec. 11, 2001

(54) CONTACT ELECTRODE FOR N-TYPE GALLIUM NITRIDE-BASED COMPOUND SEMICONDUCTOR AND METHOD FOR FORMING THE SAME

(75) Inventors: Masaaki Nido; Yukihiro Hisanaga, both of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,937

(22) Filed: Jan. 14, 1998

(30) Foreign Application Priority Data

Jan. 14, 1997 (JP) .................................................. 9-004403

(51) Int. Cl.⁷ .................................................. H01L 23/48

(52) U.S. Cl. ............................ 257/745; 257/763; 257/768

(58) Field of Search ..................................... 257/745, 749, 257/763, 768; 438/46; 372/46, 45

(56) References Cited

U.S. PATENT DOCUMENTS

| | | | |
|---|---|---|---|
| 5,247,533 | * 9/1993 | Okazaki et al. | 372/45 |
| 5,317,190 | * 5/1994 | Fleischman et al. | 257/745 |
| 5,563,422 | * 10/1996 | Nakmura et al. | 257/745 |
| 5,804,461 | * 9/1998 | Beyea et al. | 438/46 |

FOREIGN PATENT DOCUMENTS

| | | |
|---|---|---|
| 7-45867 | 2/1995 | (JP) . |
| 7-221103 | 8/1995 | (JP) . |
| 8-32115 | 2/1996 | (JP) . |
| 8-64871 | 3/1996 | (JP) . |

OTHER PUBLICATIONS

Baca et al., "A survey of ohmic contacts to III–V compound semiconductors", Thin Solid Films, pp 599–606, Jan. 1997.*

Niebuhr et al., "Electrical and Optical Properties Of Oxygen Doped GaN Grown By MOCVD Using N sub 2 O", Journal of Electronic Materials, vol. 26, No. 10, pp. 1127–1130, 1997.*

A.T. Ping et al., "Ohmic Contacts to n–type GaN Using Pd/Al Metallization", Journal of Electronic Materials, vol. 25, No. 5, 1996, pp. 819–824.

Z. Fan et al., "Very low resistance multilayer ohmic contact to n–GaN", Applied Physics Letters, vol. 68, No. 12, Mar. 18, 1996, pp. 1672–1674.

* cited by examiner

Primary Examiner—Long Pham
Assistant Examiner—William David Coleman
(74) Attorney, Agent, or Firm—Sughrue, Mion, Zinn, Macpeak & Seas, PLLC

(57) ABSTRACT

For forming a contact electrode to an n-type contact layer of a gallium nitride-based compound semiconductor, the n-type contact layer of the gallium nitride-based compound semiconductor is exposed to an oxygen plasma to form an oxygen-doped surface layer in a surface of the n-type contact layer, and then, an electrode metal is formed on the oxygen-doped surface layer. With this arrangement, an n-type contact electrode having a low specific contact resistance is obtained with good reproducibility, with performing no annealing after formation of the electrode metal.

19 Claims, 4 Drawing Sheets

CONTACT ELECTRODE FOR N-TYPE GALLIUM NITRIDE-BASED COMPOUND SEMICONDUCTOR AND METHOD FOR FORMING THE SAME

BACKGROUND OF THE INVENTION

1. Field of the Invention

The present invention relates to a contact electrode for a gallium nitride-based compound semiconductor device and a method for forming the same, and more specifically to an n-type contact electrode having a low specific contact resistance, for a gallium nitride-based compound semiconductor device and a method for forming the same.

2. Description of Related Art

An n-type contact electrode for a gallium nitride-based compound semiconductor device has realized a relatively low specific contact resistance by using a multi-layer or alloy electrode and an n-type GaN contact layer. For example, Japanese Patent Application Pre-examination Publication No. JP-A-07-045867, the content of which is incorporated by reference in its entirety into this application, and U.S. Pat. No. 5,563,422 claiming Convention Priorities based on eight Japanese patent applications including said Japanese patent application, the content of which is incorporated by reference in its entirety into this application, disclose that an alloy of Ti (titanium) and Al (aluminum) and a multi-layer film of Ti and Al are preferred as the n-type contact electrode. This will be called a "first prior art example" hereinafter.

Referring to FIG. 1, there is shown a diagrammatic sectional view of the n-type contact electrode of the first prior art example. As shown in FIG. 1, the n-type contact electrode has a construction in which a Ti layer 102 and an Al layer 103 are deposited on an n-type GaN contact S layer 101 in the named order. In this construction, an ohmic characteristics is obtained by annealing at a temperature of not less than 400° C.

Referring to FIGS. 2A to 2D, there are shown diagrammatic sectional views for illustrating one method for forming the electrode structure of the first prior art example. This method is disclosed by A. T. Ping et al, "Ohmic Contacts to n-type GaN Using Pd/Al Metallization", Journal of Electronic Materials, Vol. 25, No. 5, 1996, pp. 819–824, the content of which is incorporated by reference in its entirety into this application. This method will be called a "second prior art example" hereinafter.

In the method of the second prior art example, first, an n-type GaN contact layer 101 is etched by a dry-etching as shown in FIG. 2A, and an ashing processing is conducted by using an oxygen plasma as shown in FIG. 2B, and thereafter, as a pre-processing, an etching is conducted by using a hydrochloric acid aqueous solution as shown in FIG. 2C, and then, the Ti layer 102 and the Al layer 103 are deposited on the n-type GaN contact layer 101 in the named order as shown in FIG. 2D. Finally, a rapid thermal annealing (abbreviated to "RTA") is conducted at a temperature of 650° C. for 30 seconds.

In this case, a specific contact resistance of $6 \times 10^{-6} \Omega cm^2$ is obtained. This specific contact resistance does not greatly change even if the RTA temperature changes in the range of 550° C. to 750° C. However, if the RTA temperature is less than 550° C. or if no annealing is conducted, the ohmic characteristics cannot be obtained.

Furthermore, Japanese Patent Application Pre-examination Publication No. JP-A-07-221103, the content of which is incorporated by reference in its entirety into this application (an English abstract of JP-A-07-221103 is available from the Japanese Patent Office and the content of the English abstract of JP-A-07-221103 is also incorporated by reference in its entirety into this application), discloses an electrode structure which has improved the electrode structure of the first prior art example. This will be called a "third prior art example" hereinafter.

In the electrode structure of this third prior art example, after a double layer metal film of Ti and Al is formed on an n-type semiconductor layer with Ti being in contact with the n-type semiconductor layer, or after an alloy film of Ti and Al is formed on the n-type semiconductor layer, a metal having a melting point higher than that of Al is deposited. The third prior art exemplifies Au, Ti, Ni, Pt, W. Mo, Cr and Cu as an the metal having the melting point higher than that of Al, and mentions that Au, Ti and Ni are particularly preferable.

Referring to FIG. 3, there is shown a diagrammatic sectional view of the n-type contact electrode of the third prior art example. As shown in FIG. 3, the n-type contact electrode has a construction having a Ti layer 102, an Al layer 103, an Ni layer 104 and an Au layer 105, which are deposited on an n-type GaN contact layer 101 in the named order. In this example, an ohmic characteristics is obtained by annealing at a temperature of not less than 400° C., similarly to the first prior art example.

In the contact electrode structure of the third prior art example, the Ni layer 104 prevents aluminum from separating out to a surface and also suppresses oxidation of aluminum. Therefore, it is advantageous in that a bonding wiring formed onto the Au layer 105 becomes difficult to be peel off.

Referring to FIGS. 4A and 4B, there are shown diagrammatic sectional views for illustrating one method for forming the electrode structure of the third prior art example. This method is disclosed by Z. Fan et al, "Very low resistance multilayer ohmic contact to n-GaN", Applied Physics Letters, Vol. 68, No. 12, Mar. 18, 1996, pp. 1672–1674, the content of which is incorporated by reference in its entirety into this application. This method will be called a "fourth prior art example" hereinafter.

In the method of the fourth prior art example, first, an n-type GaN contact layer 101 is etched by a dry-etching as shown in FIG. 4A, and then, a Ti layer 102, an Al layer 103, an Ni layer 104 and an Au layer 105 are deposited on the n-type GaN contact layer 101 in the named order as shown in FIG. 4B. Finally, the RTA processing is conducted at a temperature of 900° C. for 30 seconds.

In this electrode structure, a specific contact resistance of $8.9 \times 10^{-8} \Omega cm^2$ is obtained, which is remarkably lower than the value obtained in the second prior art example. In this case, it is important that the Ni layer 104 and the Al layer 103 are thick. In addition, it is an indispensable condition for obtaining a low specific contact resistance that Ni and Au never diffuse into the n-type GaN contact layer 101. On the other hand, it was reported that when no annealing is conducted, the specific contact resistance is $3.3 \times 10^{-6} \Omega cm^2$.

In the above mentioned prior art examples, a minimum specific contact resistance of $8.9 \times 10^{-8} \Omega cm^2$ is obtained in the fourth prior art example. However, the annealing at as a high temperature as 900° C. deteriorates other electrodes, semiconductor films and insulator films in the case that a semiconductor device is manufactured, and therefore, resultantly remarkably restricts a device manufacturing process.

Accordingly, it is necessary to lower a necessary annealing temperature. In addition, the fourth prior art reported that when no annealing is conducted, the specific contact resistance of $3.3 \times 10^{-6} \Omega cm^2$ obtained.

The inventors actually manufactured the n-type contact electrodes in the same process as the fourth prior art example, and measured a contact characteristics of the n-type contact electrodes manufactured. However, no ohmic characteristics could be obtained when the annealing was conducted at a temperature of not greater than 400° C. or when no annealing was conducted. This is because of damage on the surface of the n-type GaN contact layer 101 by the dry etching in the step shown in FIG. 4A, with the result that it is difficult to obtain the ohmic characteristics with good reproducibility, when the annealing is conducted at a temperature of not greater than 400° C. or when no annealing is conducted. Furthermore, it is not preferred that damage remains given on the contact layer when the annealing is not conducted.

Furthermore, in the electrode structures of the first and third prior art examples and in the electrode forming method of the second prior art example, no ohmic characteristics were obtained when the annealing was conducted at a temperature of not greater than 400° C. or when no annealing was conducted.

Therefore, a technology for forming a low resistance n-contact electrode at a low annealing temperature is demanded.

In addition, when a large area for the n-contact electrode can be ensured, even if the specific contact resistance is not so low, if the ohmic characteristics of the n-contact can be obtained with good reproducibility with no annealing, the device manufacturing process can be simplified and also the degree of freedom in the manufacturing steps can be made large.

SUMMARY OF THE INVENTION

Accordingly, it is an object of the present invention to provide an n-type contact electrode having a low specific contact resistance and a method for forming the same, which have overcome the above mentioned defect of the conventional one.

Another object of the present invention is to provide an n-type contact electrode having a low specific contact resistance, for a gallium nitride-based compound semiconductor and a method for forming the same with no annealing step.

Still another object of the present invention is to provide an n-type contact electrode having a low specific contact resistance, for a gallium nitride-based compound semiconductor and a method for forming the same by performing an annealing at a low temperature.

The above and other objects of the present invention are achieved in accordance with a first aspect of the present invention by a contact electrode having a further low specific contact resistance, including a high concentration oxygen-doped surface layer formed in a surface of an n-type contact layer of a gallium nitride-based compound semiconductor, and a metal electrode formed on the oxygen-doped surface layer.

The high concentration oxygen-doped surface layer can be formed for example by exposing the n-type contact layer of the gallium nitride-based compound semiconductor to an oxygen plasma. In this case, oxygen enters in the n-type gallium nitride-based compound semiconductor contact layer, a high concentration of oxygen donors are formed in a surface of the n-type gallium nitride-based compound semiconductor contact layer. Since good donors are formed in the surface of the n-type gallium nitride-based compound semiconductor contact layer, an n-type contact electrode having a low specific contact resistance is obtained with good reproducibility, with performing no annealing.

In an embodiment of the n-type contact electrode, the metal electrode is formed of a metal multilayer film including a Ti layer in contact with the oxygen-doped surface layer and an Al layer formed on the Ti layer, or a metal multilayer film including a Ti/Al alloy layer in contact with the oxygen-doped surface layer. Preferably, a Pt film is formed on the metal multilayer film.

According to a second aspect of the present invention, there is provided a method for forming a contact electrode, including the step of exposing an n-type contact layer of a gallium nitride-based compound semiconductor to an oxygen plasma to form an oxygen-doped surface layer in a surface of the n-type contact layer, and forming an electrode metal on the oxygen-doped surface layer.

In the method in accordance with the second aspect of the present invention, by exposing an n-type contact layer of a gallium nitride-based compound semiconductor to an oxygen plasma, oxygen donors are formed in a surface of the n-type gallium nitride-based compound semiconductor contact layer. By this processing, not only the oxygen-doped surface layer is formed in the surface of the n-type gallium nitride-based compound semiconductor contact layer, but also carbon is removed from the surface of the n-type gallium nitride-based compound semiconductor contact layer to which an electrode is to be formed. Therefore, an n-type contact electrode having a low specific contact resistance is obtained, and a good contact interface is obtained.

In the method in accordance with the second aspect of the present invention, after the oxygen-doped surface layer is formed by the oxygen plasma processing, an electrode metal is formed on the oxygen-doped surface layer. If an acid processing were conducted after the oxygen plasma processing as in the second prior art example explained hereinbefore, oxygen is removed, with the result that the oxygen donors are reduced, and therefore, an n-type contact electrode having a low specific contact resistance is no longer obtained. On the other hand, if an electrode metal is formed on the oxygen-doped surface layer with conducting no acid processing after the oxygen plasma processing but before formation of the electrode, even if no annealing is conducted, an n-type contact electrode having an ohmic characteristics is obtained with good reproducibility.

In one embodiment of the method in accordance with the second aspect of the present invention, after the electrode metal is formed on the oxygen-doped surface layer, an annealing can be conducted. By conducting the annealing, it is possible to obtain a specific contact resistance which is lower than that obtained when no annealing is conducted. A temperature for this annealing is preferably 500° C. to 600° C.

According to a third aspect of the present invention, there is provided a method for forming a contact electrode, including the step of dry-etching an n-type contact layer of a gallium nitride-based compound semiconductor, exposing the n-type contact layer to an oxygen plasma to form an oxygen-doped surface layer in a surface of the n-type contact layer, forming an electrode metal on the oxygen-doped surface layer, and thereafter, conducting an annealing. This annealing is conducted preferably at a temperature of 600° C. to 800° C.

In the method in accordance with the third aspect of the present invention, since the dry etching is conducted, crystal defect occurs in the surface region of the n-type contact layer. Therefore, differently from the method in accordance with the second aspect of the present invention, the ohmic characteristics cannot be obtained if the annealing is not conducted at a temperature of not less than 500° C. However, if the annealing is conducted at a temperature of not less than 600° C., it is possible to obtain a specific contact resistance which is further lower than that obtained in the method in accordance with the second aspect of the present invention. The reason for this is considered to be that because of the crystal defect generated by the dry etching, the alloying between the electrode and the contact layer is facilitated at the time of the annealing.

In an embodiment of the methods in accordance with the second and third aspects of the present invention, the metal electrode is formed of a metal multilayer film including a Ti layer in contact with the oxygen-doped surface layer and an Al layer formed on the Ti layer, or a metal multilayer film including a Ti/Al alloy layer in contact with the oxygen-doped surface layer. Preferably, a Pt film is formed on the metal multilayer film.

The above and other objects, features and advantages of the present invention will be apparent from the following description of preferred embodiments of the invention with reference to the accompanying drawings.

BRIEF DESCRIPTION THE DRAWINGS

Figure 6A:
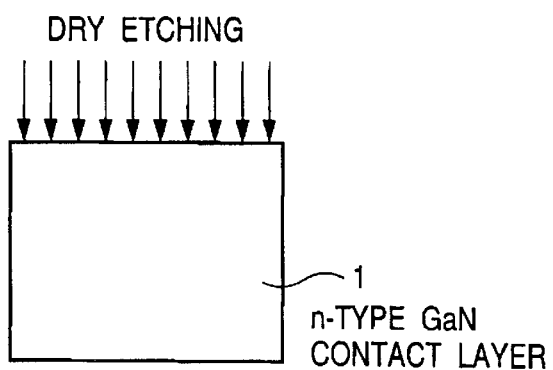
Figure 6B:
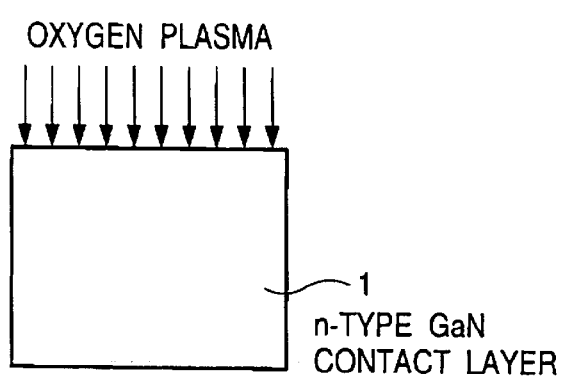
Figure 6C:
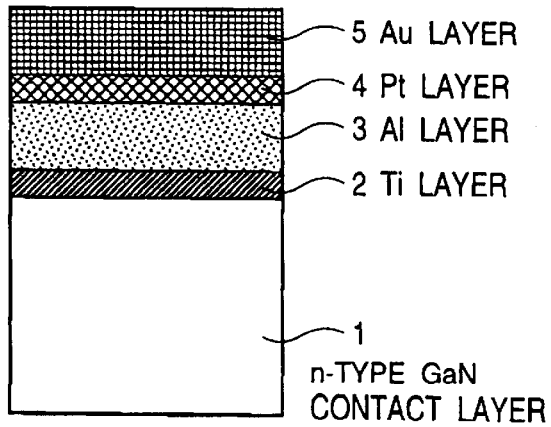
Figure 7:
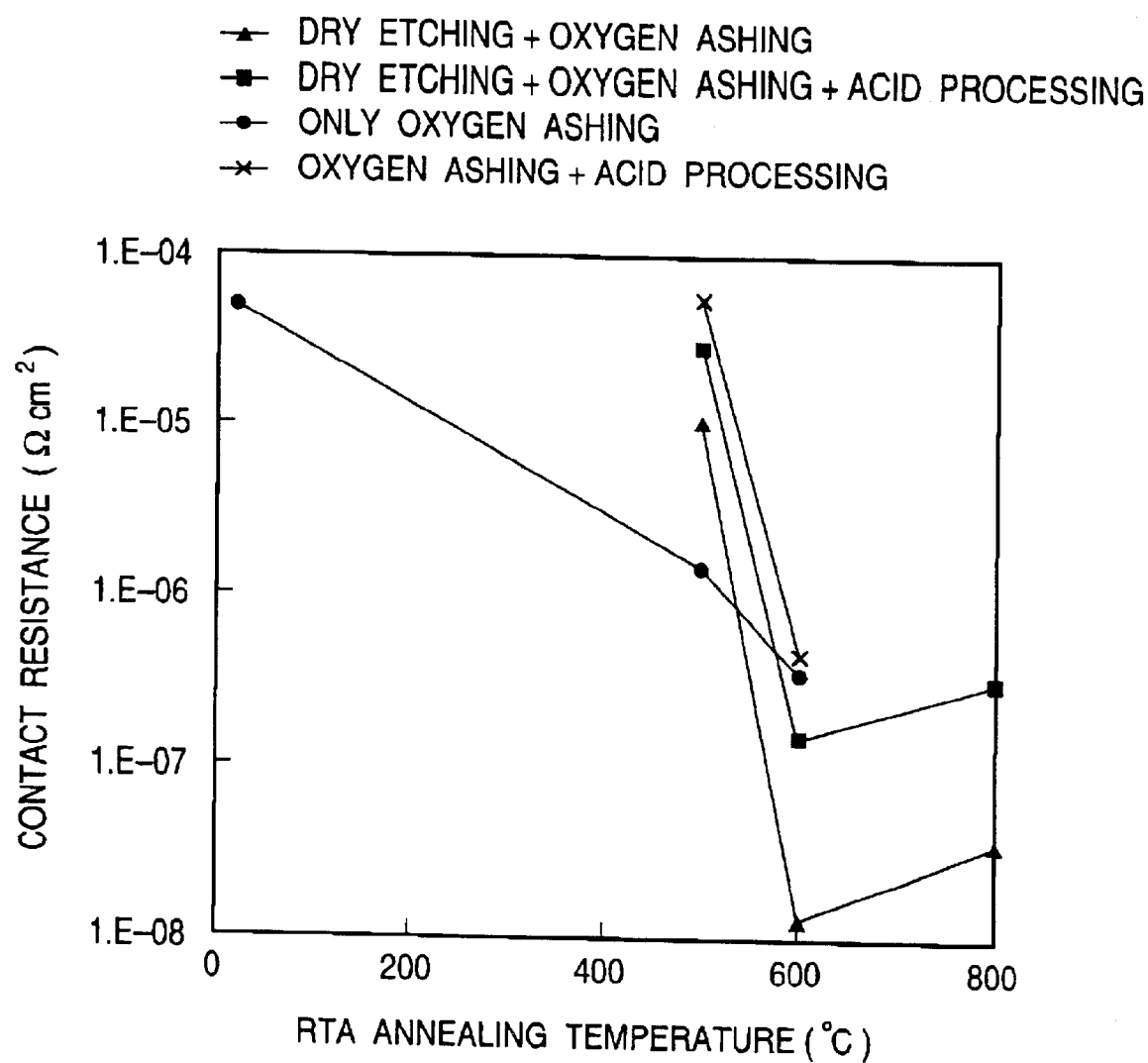

FIGS. 6A, 6B and 6C are diagrammatic sectional views for illustrating a third embodiment of the method in accordance with the present invention for forming the n-type electrode; and FIG. 7 is a graph illustrating a relation between the RTA annealing temperature and the specific contact resistance in n-type electrodes formed in accordance with the present invention and in accordance with the prior art.

DESCRIPTION OF THE PREFERRED EMBODIMENT

EMBODIMENT 1

First, a first embodiment of the method in accordance with the present invention for forming the n-type electrode will be described with reference to FIGS. 5A and 5B.

Figure 1:
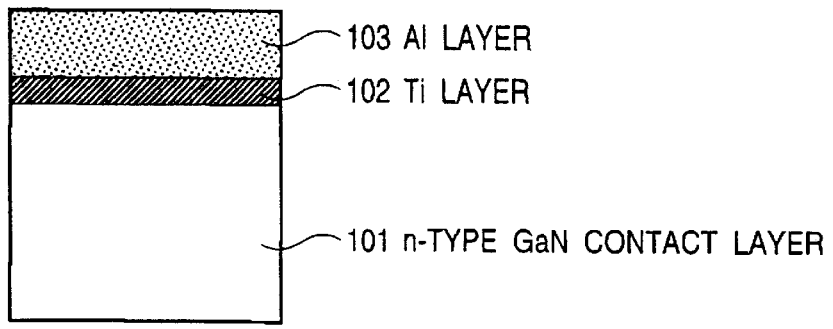
FIG. 1 is a diagrammatic sectional view of the n-type contact electrode of the first prior art example.
Figure 2A:
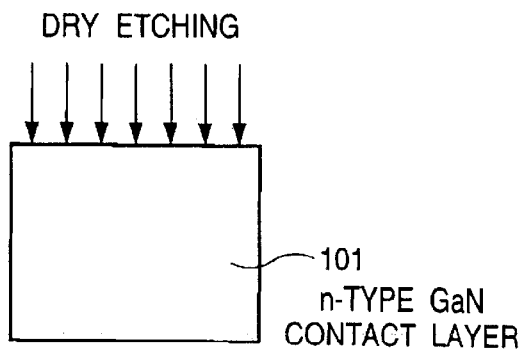
FIGS. 2A to 2D are diagrammatic sectional views for illustrating one method for forming the electrode structure of the first prior art example.
Figure 2B:
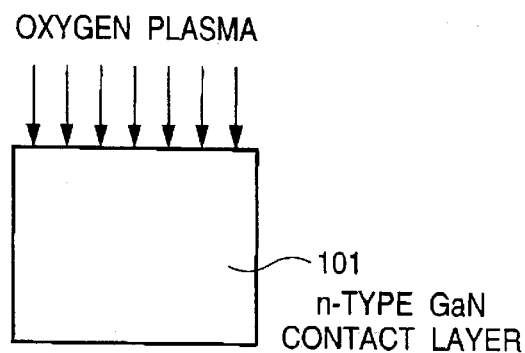
Figure 2C:
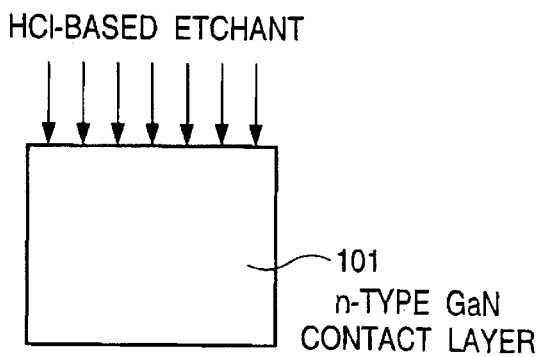
Figure 2D:
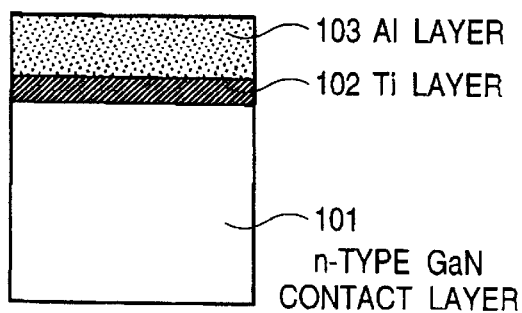
Figure 3:
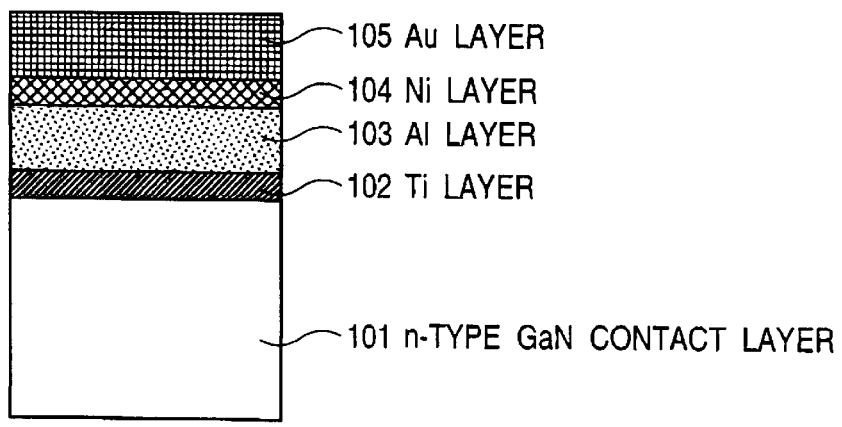
FIG. 3 is a diagrammatic sectional view of the n-type contact electrode of the third prior art example.
Figure 4A:
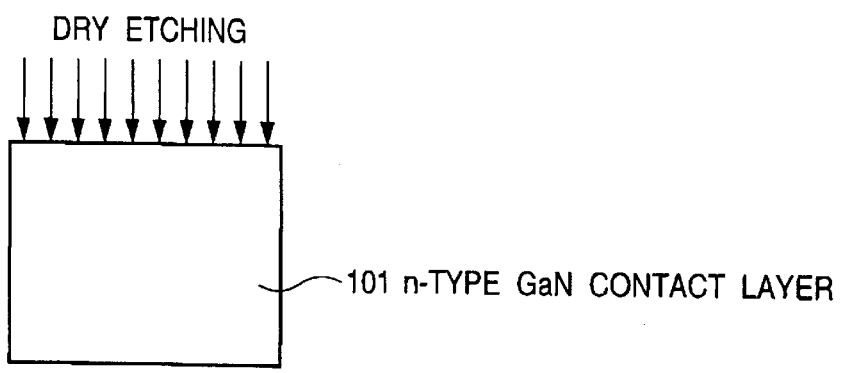
FIGS. 4A and 4B are diagrammatic sectional views for illustrating one method for forming the electrode structure of the third prior art example.
Figure 4B:
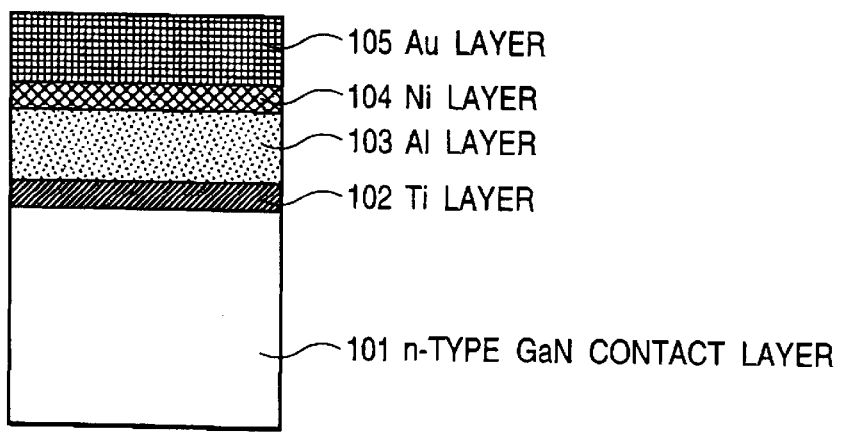
Figure 5A:
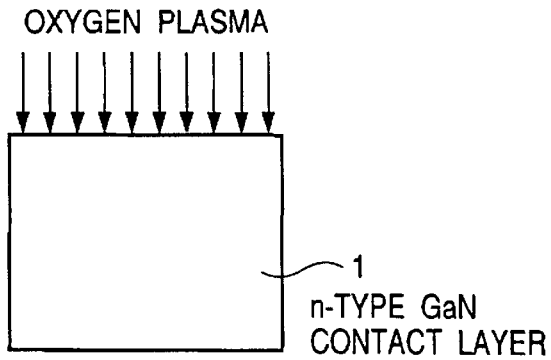
FIGS. 5A and 5B are diagrammatic sectional views for illustrating a first embodiment of the method in accordance with the present invention for forming the n-type electrode.
Figure 5B:
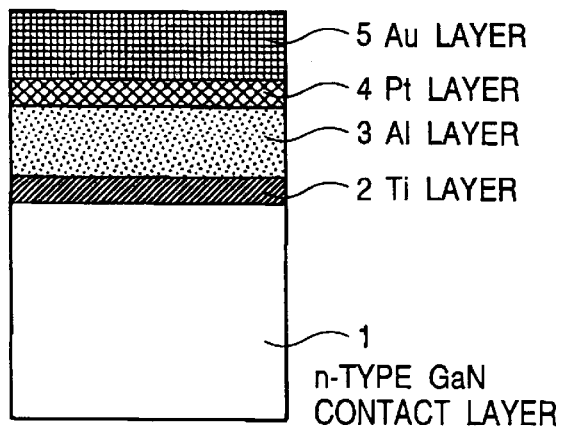

As shown in FIG. 5A, an oxygen plasma ashing processing is performed for a surface of an n-type GaN contact layer 1, to form a high concentration oxygen-doped surface layer on the surface of an n-type GaN contact layer 1, and thereafter, without performing any additional processing, a Ti layer 2, an Al layer 3, a Pt layer 4 and an Au layer 5 are deposited on the surface of the n-type GaN contact layer 1 (namely, on the high concentration oxygen-doped surface layer) in the named order to form a metal electrode, as shown in FIG. 5B. After the metal electrode is formed, no annealing is performed. The oxygen plasma ashing processing was performed for two minutes under an oxygen pressure of 0.8 torr and a plasma power of 200W.

Characteristics of the n-type contact electrode thus formed were measured. The n-type contact electrode having an ohmic characteristics could be formed with good reproducibility, without annealing. The specific contact resistance was $5 \times 10^{-5} \Omega cm^2$.

In the first embodiment, after the oxygen plasma processing, the metal electrode is formed on the surface of the oxygen-doped surface layer without conducting an acid processing to the n-type GaN contact layer 1. With this method, even if no annealing is performed, the n-type contact electrode having the ohmic characteristics can be obtained with good reproducibility.

EMBODIMENT 2

In a second embodiment of the method in accordance with the present invention for forming the n-type electrode, the RTA processing is conducted for 30 seconds at a temperature of 500° C., after the first embodiment of the method in accordance with the present invention for forming the n-type electrode is performed. As a result, reproducibility of the ohmic characteristics of the n-type contact electrode obtained was further improved, and the specific contact resistance obtained was $1.4 \times 10^{-6} \Omega cm^2$, which is lower than that obtained in the first embodiment of the method in accordance with the present invention.

EMBODIMENT 3

Now, a third embodiment of the method in accordance with the present invention will be described with reference to FIGS. 6A to 6C.

First, as shown in FIG. 6A, a dry etching is performed to a surface of an n-type GaN contact layer 1, and then, as shown in FIG. 6B, an oxygen plasma ashing processing is performed for the surface of an n-type GaN contact layer 1, to form a high concentration oxygen-doped surface layer on the surface of an n-type GaN contact layer 1.

Thereafter, without performing any additional processing, a Ti layer 2, an Al layer 3, a Pt layer 4 and an Au layer 5 are deposited on the surface of the n-type GaN contact layer 1 (namely, on the high concentration oxygen-doped surface layer) in the named order to form a metal electrode, as shown in FIG. 6C. Furthermore, an annealing is performed.

The oxygen plasma ashing processing was performed under the same condition as that in the first embodiment. The annealing is an RTA processing for 30 seconds a temperature of 600° C.

In the third embodiment, most excellent reproducibility of the ohmic characteristics was obtained, and the specific contact resistance obtained was $1.2 \times 10^{-8} \Omega cm^2$, which is lower than that obtained in the fourth prior art example.

In the first to third embodiments, the metal electrode is formed of a metal multilayer film including the Ti layer 2 in contact with the n-type contact layer and the Al layer formed on the Ti layer 2. However, when the metal electrode was formed of a metal multilayer film including a Ti/Al alloy layer in contact with the n-type contact layer, a similar effect could be obtained.

Also in the electrode structure of the first to third embodiments, the Pt film is formed on the metal multilayer film. This Pt film prevents the Al layer from diffusing on an electrode surface and from being oxidized, and also prevents the Au layer from diffusing into the Al layer and its underlying layer.

This function is the same as that of the Ni layer 104 in the third and fourth prior art examples. However, Pt has a melting point higher than that of Ni, and the diffusion preventing function of Pt is more excellent than Ni. In addition, at a high temperature annealing, Ni itself diffuses, but Pt almost never diffuses.

Referring to FIG. 7, there is shown a graph illustrating a relation between the RTA annealing temperature and the specific contact resistance in n-type electrodes formed in accordance with the present invention and in accordance with the prior art. In all examples, the metal was Ti/Al/Pt/Au, and the RTA annealing time was a constant time of 30 seconds. Therefore, the graph of FIG. 7 illustrates dependency of the specific contact resistance upon the RTA annealing temperature.

In the graph of FIG. 7, "●" (solid circle) indicates the specific contact resistance when the contact electrode was formed in accordance with the electrode forming methods of the first and second embodiments.

The situation that the annealing temperature was 20° C., namely, no annealing was performed, corresponds to the first embodiment, and the situation that the annealing temperature was 500° C., corresponds to the second embodiment. The specific contact resistance obtained was $5 \times 10^{-5} \Omega cm^2$ in the first embodiment and $1.4 \times 10^{-6} \Omega cm^2$ in the second embodiment.

In the graph of FIG. 7, "x" (cross) indicates a comparative example 1 in which, in addition to the electrode forming methods of the first and second embodiments, an acid processing is performed for the surface of the n-type GaN contact layer 1 just before formation of the electrode, to reduce the oxygen donors. In the comparative example 1, when no annealing was performed, the ohmic characteristics could not be obtained with good reproducibility. In addition, although the annealing was performed at a temperature of 500° C., the specific contact resistance was higher than that of the second embodiment by about two figures.

A difference between the first and second embodiments and the comparative example 1 is particularly remarkable when the annealing temperature was not greater than 500° C.

The reason for the high specific contact resistance in the comparative example 1 is considered to be that, because of the acid processing to the surface of the n-type GaN contact layer 1, the oxygen-doped surface layer formed on the surface of the n-type GaN contact layer 1 by the oxygen plasma processing was removed.

As seen from the above, according to the electrode forming method of the first embodiment, it is possible to obtain the n-type contact electrode having the ohmic characteristics with high reproducibility, even if no annealing is performed. In this case, the specific contact resistance is relatively high, but if a large contact area is ensured by contriving a device structure, a relative high specific contact resistance is no longer a problem, and on the other hand, a low temperature device process can be advantageously used.

Furthermore, according to the electrode forming method of the second embodiment, it is necessary to perform the annealing at a temperature of not less than 500° C., but it is possible to reduce the specific contact resistance by about one figure in comparison with the first embodiment. Therefore, a necessary contact area can be reduced in comparison with the first embodiment. In addition, if a device process temperature in the order of 500° C. is permissible, it is possible to obtain a contact resistance lower than the first embodiment.

In the electrode forming method in accordance with the third embodiment of the present invention, after the n-type GaN contact layer is etched by the dry etching and then exposed to the oxygen plasma, the electrode is formed on the n-type GaN contact layer without performing the acid processing to the n-type GaN contact layer. If the dry etching is conducted, crystal defect occurs in the surface region of the n-type contact layer. Therefore, differently from the method in accordance with the first embodiment of the present invention, the ohmic characteristics cannot be obtained if the annealing is not conducted at a temperature of not less than 500° C. However, if the annealing is conducted at a temperature of 600° C., it is possible to obtain a specific contact resistance which is further lower than those obtained in the methods in accordance with the first and second embodiments of the present invention. The reason for this is considered to be that because of the crystal defect generated by the dry etching, the alloying between the electrode and the contact layer is facilitated at the time of the annealing.

The graph of FIG. 7 also illustrates the electrode forming method in accordance with the third embodiment of the present invention, and a comparative example 2 in which, in addition to the electrode forming method in accordance with the third embodiment of the present invention, an acid processing is performed for the surface of the n-type GaN contact layer 1 after the oxygen plasma processing but before formation of the electrode. In the graph of FIG. 7, "A▲" (solid triangle) indicates the electrode forming method in accordance with the third embodiment of the present invention, and "■" (solid square) indicates the comparative a example 2.

In both of the electrode forming methods in accordance with the third embodiment of the present invention and the comparative example 2, no n-type contact electrode having the ohmic characteristics, could be obtained either when no annealing was conducted or when the annealing was performed at a temperature of less than 500° C., but a n-type contact electrode having the ohmic characteristics could be obtained when the annealing was performed at a temperature of not less than 500° C. In the annealing temperature range of 600° C. to 800° C., when the electrode forming method in accordance with the third embodiment of the present invention is used, the specific contact resistance can be reduced by about one figure, in comparison with the comparative example 2.

In particular, the electrode forming method in accordance with the third embodiment of the present invention could obtain, with the annealing temperature of 600° C., the specific contact resistance of $1.2 \times 10^{-8} \Omega cm^2$, which is smaller than the fourth prior art example requiring the annealing temperature of 900° C., by about one figure.

Thus, the electrode forming method in accordance with the third embodiment of the present invention can obtain, with a relatively low annealing temperature, the specific contact resistance which is further lower than the prior art examples. Accordingly, the electrode forming method in accordance with the third embodiment of the present invention can advantageously be used when a device process temperature in the order of 600° C. is permissible and when it is necessary to reduce the contact area as small as possible.

The invention has thus been shown and described with reference to the specific embodiments. However, it should be noted that the present invention is in no way limited to the details of the illustrated structures but changes and modifications may be made within the scope of the appended claims.

What is claimed is:

1. A contact electrode to an n-type contact layer of a gallium nitride-based compound semiconductor comprising:

a high-concentration oxygen-doped surface layer in a surface of said n-type contact layer of said gallium nitride-based compound semiconductor; and a metal electrode on said oxygen-doped surface layer such that the metal electrode is in contact with the surface layer containing oxygen.

2. A contact electrode claimed in claim 1, wherein:

said metal electrode is formed of a metal multilayer film which includes a Ti layer in contact with said oxygen-doped surface layer and an Al layer formed on said Ti layer.

3. A contact electrode claimed in claim 2 wherein a Pt film is formed on said metal multilayer film.

4. A contact electrode claimed in claim 1, wherein:

said metal electrode is formed of a metal multilayer film which includes a Ti/Al alloy layer in contact with said oxygen-doped surface layer.

5. A contact electrode claimed in claim 4, wherein:

a Pt film is formed on said metal multilayer film.

6. A contact electrode claimed in claim 5, wherein:

a Au film is formed on said Pt film.

7. A contact electrode claimed in claim 3, wherein:

a Au film is formed on said Pt film.

8. A contact electrode to an n-type contact layer of a gallium nitride-based compound semiconductor, comprising:

high concentration oxygen-doped, surface layer in a surface of said n-type contact layer of said gallium nitride-based compound semiconductor, and a metal electrode on said surface layer containing oxygen.

9. A contact electrode claimed in claim 8, wherein:

said metal electrode is formed of a metal multilayer film which includes a Ti layer in contact with said surface layer and an Al layer formed on said Ti layer.

10. A contact electrode claimed in claim 9, wherein:

a Pt film is formed on said metal multilayer film.

11. A contact electrode claimed in claim 10, wherein:

a Au film is formed on said Pt film.

12. A contact electrode claimed in claim 8, wherein:

said metal electrode is formed of a metal multilayer film which includes a Ti/Al alloy layer in contact with said surface layer.

13. A contact electrode claimed in claim 12, wherein:

a Pt film is formed on said metal multilayer film.

14. A contact electrode claimed in claim 13, wherein:

a Au film is formed on said Pt film.

15. A contact electrode to an n-type GaN contact layer of a gallium nitride based compound semiconductor, comprising:

an oxygen-doped surface layer in a surface of said n-type contact GaN layer of said gallium nitride-based compound semiconductor; and a metal electrode on said oxygen-doped surface layer and in ohmic contact with said oxygen-doped surface layer.

16. A contact electrode claimed in claim 15 wherein said metal electrode is formed of a metal multilayer film which includes Ti layer in contact with said oxygen-doped surface layer and an Al layer formed on said Ti layer.

17. A contact electrode claimed in claim 16 wherein a Pt film is formed on said metal multilayer film.

18. A contact electrode claimed in claim 15 wherein said metal electrode is formed of a metal multilayer film which includes either a Ti/Al alloy layer in contact with said oxygen-doped surface layer.

19. A contact electrode claimed in claim 18 wherein a Pt film is formed on said metal multilayer film.

* * * * *